United States Patent
Peschke et al.

(10) Patent No.: US 11,932,791 B2
(45) Date of Patent: Mar. 19, 2024

(54) PHOSPHOR PROCESS FOR PRODUCING A PHOSPHOR AND OPTOELECTRONIC DEVICE

(71) Applicant: OSRAM Opto Semiconductors GmbH, Regensburg (DE)

(72) Inventors: Simon Peschke, Aßling (DE); Stefan Lange, Augsburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 428 days.

(21) Appl. No.: 17/431,438

(22) PCT Filed: Feb. 14, 2020

(86) PCT No.: PCT/EP2020/053946
§ 371 (c)(1),
(2) Date: Aug. 17, 2021

(87) PCT Pub. No.: WO2020/169479
PCT Pub. Date: Aug. 27, 2020

(65) Prior Publication Data
US 2022/0135880 A1 May 5, 2022

(30) Foreign Application Priority Data
Feb. 18, 2019 (DE) .................... 10 2019 104 008.6

(51) Int. Cl.
*C09K 11/77* (2006.01)
*C01B 21/082* (2006.01)
(Continued)

(52) U.S. Cl.
CPC .... *C09K 11/77347* (2021.01); *C01B 21/0823* (2013.01); *C09K 11/77348* (2021.01);
(Continued)

(58) Field of Classification Search
CPC ........ C09K 11/77347; C09K 11/77348; H01L 33/502; C01B 21/0823; C01P 2002/76
See application file for complete search history.

(56) References Cited

U.S. PATENT DOCUMENTS

2008/0296596 A1 12/2008 Setlur et al.
2013/0001815 A1 1/2013 Yamao et al.
(Continued)

FOREIGN PATENT DOCUMENTS

WO 2017136423 A1 8/2017

OTHER PUBLICATIONS

International search report issued for the corresponding international patent application No. PCT/EP2020/053946, dated May 7, 2020, 5 pages (for informational purposes only).
(Continued)

*Primary Examiner* — C Melissa Koslow
(74) *Attorney, Agent, or Firm* — Viering, Jentschura & Partner mbB; Robert M Bilotta, Jr.

(57) ABSTRACT

A phosphor having the general formula $EA_7A_2T1_{t1}T2_{t2}T3_{t3}N_nO_o$:RE. EA is selected from the group of divalent elements. A is selected from the group of monovalent elements. T1 is selected from the group of trivalent elements. T2 is selected from the group of tetravalent elements. T3 is selected from the group of pentavalent elements. RE is an activator element. $16+3 \cdot t1+4 \cdot t2+5 \cdot t3-3n-2 \cdot o=0$. $t1+t2+t3=5$; $n+o=16$; $0 \leq t1 \leq 4$; $0 \leq t2 \leq 5$; $0 \leq t3 \leq 5$; $0 \leq n \leq 9$; $7 \leq o \leq 16$.

20 Claims, 6 Drawing Sheets

(51) Int. Cl.
  *H01L 33/50* (2010.01)
  *H01S 5/0225* (2021.01)
(52) U.S. Cl.
  CPC .......... *H01L 33/502* (2013.01); *H01S 5/0225* (2021.01); *C01P 2002/54* (2013.01); *C01P 2002/76* (2013.01); *C01P 2002/77* (2013.01)

(56) References Cited

U.S. PATENT DOCUMENTS

2013/0293092 A1  11/2013  Fukuda et al.
2015/0070875 A1  3/2015  Hirosaki et al.

OTHER PUBLICATIONS

German Search Report issued for the corresponding German patent application No. 10 2019 104 008.6, dated Nov. 12, 2019, 5 pages (for informational purposes only).
Abudurusuli, A., Wu, K., Pan, S.: "Four new quaternary chalcogenides A2Ba7Sn4Q16 (A = Li, Na; Q = S, Se): syntheses, crystal structures determination, nonlinear optical performance invenstigation", New J. Chem., 2018, pp. 3350-3355, Royal society of chemistry, issue 42.
Chiu, Y.-C. et al., "Eu2+-activated silicon-oxynitride Ca3Si2O4N2: a green-emitting phosphor for white LEDs", Optics Express, published May 9, 2011, pp. 9, vol. 19, No. S3.
Lv, W. et al., "Synthesis, Structure, and Luminescence Properties of K2Ba7Si16O40:Eu2+ for White Light Emitting Diodes", The Journal of Physical Chemistry, 2014, pp. 4649-4655, vol. 118, ACS Publications.
F. Liebau, "Classification of Silicates", retrieved on Jan. 10, 2020, 24 pages.

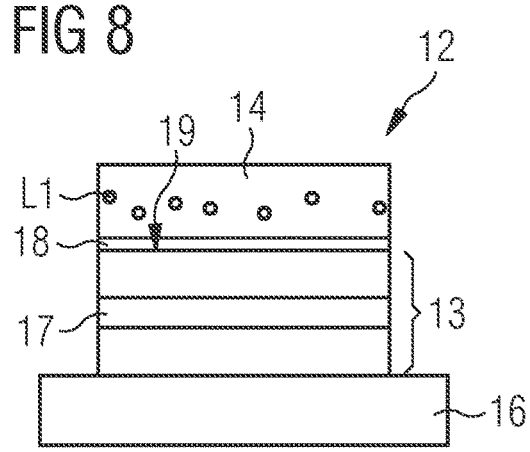
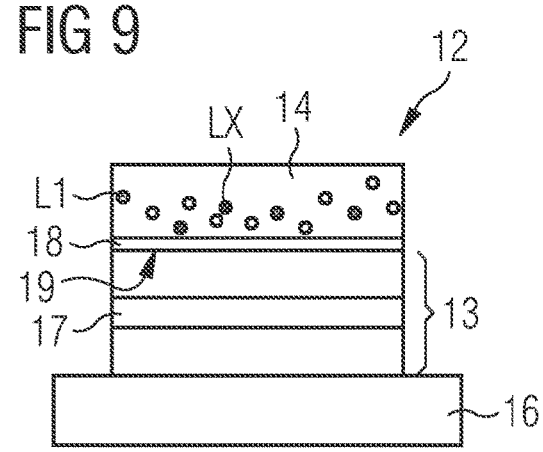
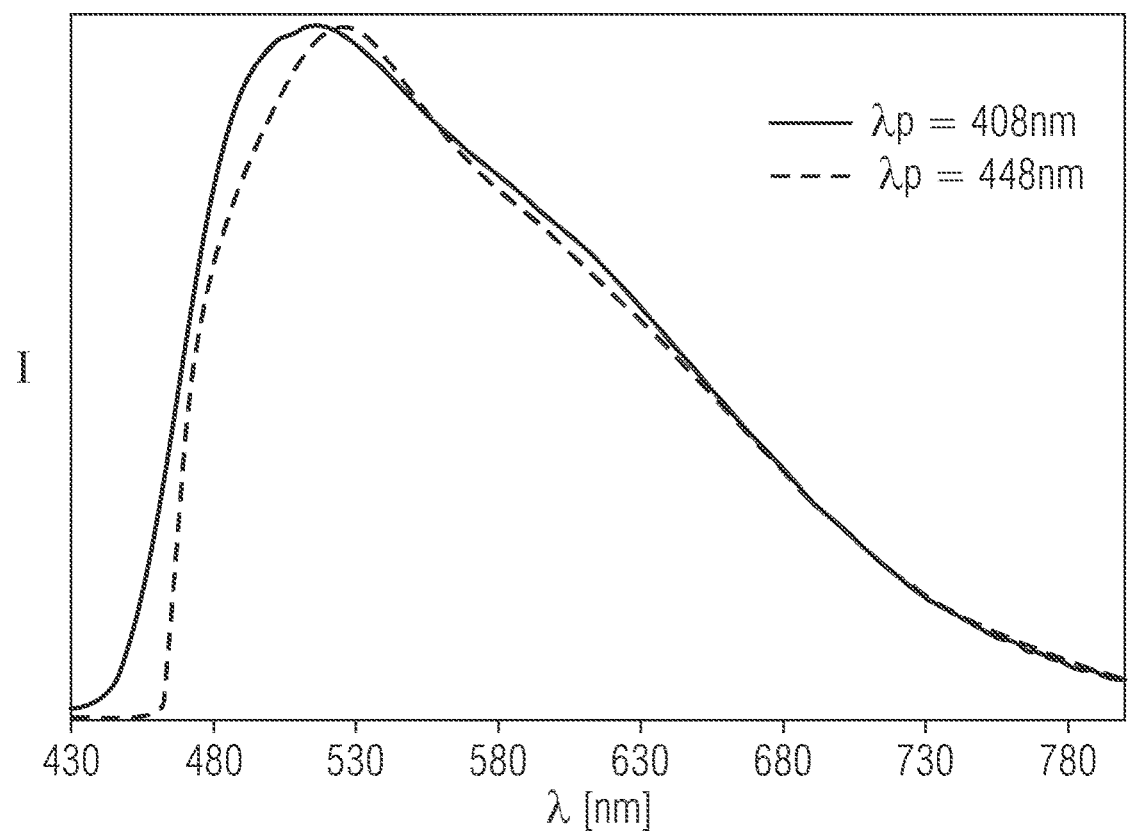

PHOSPHOR PROCESS FOR PRODUCING A PHOSPHOR AND OPTOELECTRONIC DEVICE

CROSS-REFERENCE TO RELATED APPLICATIONS

The present application is a national stage entry according to 35 U.S.C. § 371 of PCT Application No. PCT/EP2020/053946 filed on Feb. 14, 2020; which claims priority to German Patent Application Serial No. 10 2019 104 008.6 filed on Feb. 18, 2019; all of which are incorporated herein by reference in their entirety and for all purposes.

TECHNICAL FIELD

A phosphor and a process for producing a phosphor are disclosed. In addition, an optoelectronic device is disclosed.

BACKGROUND

A problem to be solved is to disclose a phosphor with increased efficiency. In addition, a process for producing such a phosphor is disclosed. Furthermore, an optoelectronic device with increased efficiency is disclosed.

SUMMARY

According to one embodiment, the phosphor comprises the general formula $EA_7A_2T1_{t1}T2_{t2}T3_{t3}N_nO_o$:RE, wherein:
EA is selected from the group of divalent elements,
A is selected from the group of monovalent elements,
T1 is selected from the group of trivalent elements,
T2 is selected from the group of tetravalent elements,
T3 is selected from the group of pentavalent elements,
RE is an activator element,
$16+3$ $t1+4$ $t2+5$ $t3-3$ $n-2$ $o=0$, and
$t1+t2+t3=5$; $n+o=16$; $0 \leq t1 \leq 4$; $0 \leq t2 \leq 5$; $0 \leq t3 \leq 5$; $0 \leq n \leq 9$; $7 \leq o \leq 16$.

Here and in the following, phosphors are described using molecular formulas. In the case of the molecular formulae given, it is possible for the phosphor to have further elements, for example in the form of impurities, wherein these impurities together having a value of at most 1 per mille, such as at most 100 ppm (parts per million), such as at most 10 ppm. According to the molecular formula described here, the phosphor comprises only nitrogen and/or oxygen as anion. However, it is not excluded that further elements, including anionic elements, are present in the form of impurities.

The phosphor comprises a crystalline, for example ceramic, host lattice into which foreign elements are introduced as activator elements. The phosphor may be a ceramic material, for example.

The activator element alters the electronic structure of the host lattice such that electromagnetic radiation with a primary wavelength is absorbed in the material and excites an electronic transition in the phosphor, which returns to the ground state while emitting electromagnetic radiation with an emission spectrum. The activator element introduced into the host lattice is thus responsible for the wavelength-converting properties of the phosphor.

By the term "wavelength-converting" is meant that irradiated electromagnetic radiation of a certain wavelength range, present with a primary wavelength, is converted into electromagnetic radiation of another, such as longer wavelength range, present of the emission spectrum. As a rule, a wavelength-converting element absorbs electromagnetic radiation of an irradiated wavelength range, converts it by electronic processes on the atomic and/or molecular level into electromagnetic radiation of another wavelength range and emits the converted electromagnetic radiation again. In particular, pure scattering or pure absorption is not understood as wavelength-converting.

For example, the phosphor may be in particle form with grain sizes between 1 micron, inclusive and 30 microns, inclusive.

The crystalline host lattice is composed of a generally periodically repeating three-dimensional unit cell. In other words, the unit cell is the smallest recurring unit of the crystalline host lattice. Here, the elements EA, A, T1, T2, T3, N and O each occupy fixed lattice sites of the three-dimensional unit cell of the host lattice. Here, the activator element RE and the divalent element EA occupy equivalent lattice sites. This means that either EA or RE is located on the said lattice site of an elementary cell.

By the term "valence" in relation to a particular element, it is meant in the present context how many further elements with opposite charge are needed in a chemical compound to achieve charge balance. This can be, for example, one element or several elements.

Elements with a valence of two are also referred to as divalent elements and are often elements that have a double positive charge in a chemical compound. This means, for example, that two further elements, which have a single negative charge in the chemical compound, or one further element, which has a double negative charge in the chemical compound, can bind to the divalent element. This leads to a charge balance. Divalent elements are generally selected from the group formed by alkaline earth elements, zinc.

Monovalent elements, i.e. elements of valency one, are often elements that have a single positive charge in a chemical compound. This means that an element with a single negative charge in a chemical compound can bind to the monovalent element. Thus a charge balance is achieved. Monovalent elements are generally selected from the group consisting of alkali elements and copper, silver and gold.

Trivalent elements, i.e. elements of valence three, are often elements that have a triple positive charge in a chemical compound. This means that an element that has a triple negative charge in a chemical compound can bind to the trivalent element. Thus, a charge balance is achieved. Trivalent elements are generally selected from the group consisting of boron, aluminum, gallium, indium, scandium, yttrium and rare earths.

Tetravalent elements, i.e. elements of valence four, are often elements which have a quadruple positive charge in a chemical compound. This means that an element that has a quadruple negative charge in a chemical compound can bind to the tetravalent element. Thus, a charge balance is achieved. As a rule, tetravalent elements are selected from the group consisting of silicon, germanium, tin, titanium, zirconium and hafnium.

Pentavalent elements, i.e. elements of valency five, are often elements that have a fivefold positive charge in a chemical compound. This means that an element which is five times negatively charged in a chemical compound can bind to the pentavalent element. Thus, a charge balance is achieved. In the present case, pentavalent elements are generally selected from the group formed by phosphorus, arsenic, vanadium, niobium, tantalum.

According to one embodiment, RE is selected from the group formed by the following elements and combinations of these elements: Mn, Cr, Ni, Ce, Pr, Nd, Sm, Eu, Tb, Dy, Ho, Er, Yb, Tm.

According to another embodiment, the host lattice of the phosphor comprises a structure comprising $T1(O,N)_4$ tetrahedra, $T2(O,N)_4$ tetrahedra, $T3(O,N)_4$ tetrahedra and $AO_4$ tetrahedra. The $T1(O,N)_4$ tetrahedra, $T2(O,N)_4$ tetrahedra, $T3(O,N)_4$ tetrahedra, and/or the $AO_4$ tetrahedra generally have a tetrahedral gap. The tetrahedral gap is a region inside the respective tetrahedron. For example, the term "tetrahedral gap" is used to refer to the region in the inside of the tetrahedron that remains unoccupied when balls that touch each other are placed in the corners of the tetrahedron.

In a non-limiting embodiment, the oxygen atoms and the nitrogen atoms of the $T1(O,N)_4$ tetrahedra and/or $T2(O,N)_4$ tetrahedra and/or $T3(O,N)_4$ tetrahedra span the tetrahedron, wherein the T1 and/or T2 and/or T3 atom being located in the tetrahedral gap of the tetrahedra spanned by the oxygen atoms and the nitrogen atoms. Here, all atoms spanning the tetrahedra form a similar distance to the T1 and/or T2 and/or T3 atom located in the tetrahedral gap.

In a non-limiting embodiment, the oxygen atoms of the $AO_4$-tetrahedra span the tetrahedra and the A atom is located in the tetrahedral gap of the tetrahedra spanned by the oxygen atoms.

According to a non-limiting embodiment of the phosphor, in the structure of the host lattice at least one $T1(O,N)_4$ tetrahedra and/or one $T2(O,N)_4$ tetrahedra and/or one $T3(O,N)_4$ tetrahedra and at least one $AO_4$ tetrahedra are each linked via a corner.

According to a further embodiment of the phosphor, the $AO_4$ tetrahedron is linked to the $T1(O,N)_4$ tetrahedra and/or the $T2(O,N)_4$ tetrahedron and/or the $T3(O,N)_4$ tetrahedron via an oxygen atom. In a non-limiting embodiment, the oxygen atom linking the $AO_4$ tetrahedron to the $T1(O,N)_4$ tetrahedron and/or the $T2(O,N)_4$ tetrahedron and/or the $T3(O,N)_4$ tetrahedron is a common oxygen atom of the $AO_4$ tetrahedron and the $T1(O,N)_4$ tetrahedron and/or the $T2(O,N)_4$ tetrahedron and/or the $T3(O,N)_4$ tetrahedron. In other words, the oxygen atom linking the $AO_4$ tetrahedron to the $T1(O,N)_4$ tetrahedron and/or the $T2(O,N)_4$ tetrahedron and/or the $T3(O,N)_4$ tetrahedron is part of the $AO_4$ tetrahedron as well as part of the $T1(O,N)_4$ tetrahedron and/or the $T2(O,N)_4$ tetrahedron and/or the $T3(O,N)_4$ tetrahedron.

According to a further embodiment, at least one $T1(O,N)_4$ tetrahedron and/or one $T2(O,N)_4$ tetrahedron and/or one $T3(O,N)_4$ tetrahedron is linked via a corner to at least one further $T1(O,N)_4$ tetrahedron and/or at least one further $T2(O,N)_4$ tetrahedron and/or at least one further $T3(O,N)_4$ tetrahedron.

According to a further embodiment of the phosphor, the $T1(O,N)_4$-tetrahedron and/or the $T2(O,N)_4$-tetrahedron and/or the $T3(O,N)_4$-tetrahedron is linked via a nitrogen atom to the further $T1(O,N)_4$-tetrahedron and/or the further $T2(O,N)_4$-tetrahedron and/or the further $T3(O,N)_4$-tetrahedron. In a non-limiting embodiment, the nitrogen atom linking the $T1(O,N)_4$-tetrahedron and/or the $T2(O,N)_4$-tetrahedron and/or the $T3(O,N)_4$-tetrahedron to the further $T1(O,N)_4$-tetrahedron and/or the further $T2(O,N)_4$-tetrahedron and/or the further $T3(O,N)_4$ tetrahedron, a common nitrogen atom of the $T1(O,N)_4$ tetrahedra and/or the $T2(O,N)_4$ tetrahedra and/or the $T3(O,N)_4$ tetrahedra. In other words, the nitrogen atom linking the $T1(O,N)_4$-tetrahedron and/or the $T2(O,N)_4$-tetrahedron and/or the $T3(O,N)_4$-tetrahedron to the further $T1(O,N)_4$-tetrahedron and/or the further $T2(O,N)_4$-tetrahedron and/or the further $T3(O,N)_4$-tetrahedron is part of both the $T1(O,N)_4$ tetrahedron and/or the $T2(O,N)_4$ tetrahedron and/or the $T3(O,N)_4$ tetrahedron and the further $T1(O,N)_4$ tetrahedron and/or the further $T2(O,N)_4$ tetrahedron and/or the further $T3(O,N)_4$ tetrahedron.

According to a further embodiment, the corner-linked $T1(O,N)_4$ tetrahedra and/or the corner-linked $T2(O,N)_4$ tetrahedra and/or the corner-linked $T3(O,N)_4$ tetrahedra form a strand. In a non-limiting embodiment, the strand comprises at least five linked $T1(O,N)_4$ tetrahedra and/or $T2(O,N)_4$ tetrahedra and/or $T3(O,N)_4$ tetrahedra. In a non-limiting embodiment, the phosphor host lattice comprises multiple strands of $T1(O,N)_4$ tetrahedra and/or $T2(O,N)_4$ tetrahedra and/or $T3(O,N)_4$ tetrahedra. Here, for example, a $T1(O,N)_4$ tetrahedron and/or a $T2(O,N)_4$ tetrahedron and/or a $T3(O,N)_4$ tetrahedron can be linked via at least one $AO_4$ tetrahedron to $T1(O,N)_4$ tetrahedra and/or $T2(O,N)_4$ tetrahedra and/or $T3(O,N)_4$ tetrahedra of the same strand or of the neighboring strand. The $AO_4$ tetrahedra link the strands comprising $T1(O,N)_4$ tetrahedra and/or the $T2(O,N)_4$ tetrahedra and/or the $T3(O,N)_4$ tetrahedra to form layers.

According to a further embodiment, the $T1(O,N)_4$ tetrahedra and/or the $T2(O,N)_4$ tetrahedra and/or the $T3(O,N)_4$ tetrahedra and the $AO_4$ tetrahedra linked via a corner form channels in which at least one EA atom is located. The channels are formed as cavities in the strands of corner-linked $T1(O,N)_4$ tetrahedra and/or corner-linked $T2(O,N)_4$ tetrahedra and/or corner-linked $T3(O,N)_4$ tetrahedra and corner-linked $AO_4$ tetrahedra.

According to one embodiment, the phosphor comprises the general formula $EA_7A_2Si_5N_4O_{12}$:RE, wherein EA is selected from the group of divalent elements. A is here selected from the group of monovalent elements and RE is an activator element.

According to another embodiment of the phosphor, EA is selected from the group formed by the following elements and combinations of these elements: Mg, Ca, Sr, Ba.

According to a further embodiment of the phosphor, A is selected from the group formed by the following elements and combinations thereof: Li, Na, K, Rb, Cs.

According to a further embodiment, RE is selected from the group consisting of rare earth elements, Mn, Cr and Ni.

According to a further embodiment, RE is selected from the group formed by the following elements and combinations of these elements: Eu, Ce, Yb.

According to a further embodiment, the phosphor comprises the following formula: $(EA_{1-a}RE_a)_7A_2Si_5N_4O_{12}$. a denotes here the molecular fraction of RE relative to EA and is between 0.001, inclusive and 0.1 inclusive. In a non-limiting embodiment, the molecular fraction of RE relative to EA is between 0.005, inclusive and 0.05 inclusive. In other words, between 0.5%, inclusive and 5% inclusive of the lattice sites of EA are occupied by RE. For example, the rare earth fraction a of a phosphor of the following formula $(EA_{1-a}RE_a)_7A_2Si_5N_4O_{12}$ is significantly reduced compared to garnet phosphors such as $Y_3(Al,Ga)_5O_{12}$:Ce (YAG) $Lu_3(Al,Ga)_5O_{12}$:Ce (LuAG). That is, the rare earth content a of a phosphor of the formula $(EA_{1-a}RE_a)_7A_2Si_5N_4O_{12}$ is significantly lower than the rare earth content of garnet phosphors, such as lutetium in LuAG. The weight fraction of rare earths in a LuAG phosphor is about 70%. The phosphor described here is therefore generally comparatively inexpensive, since few rare earths are used.

According to a non-limiting embodiment, the phosphor comprises the formula $Sr_7Li_2Si_5N_4O_{12}$:RE. In a non-limiting embodiment, RE is $Eu^{2+}$. RE, for example $Eu^{2+}$, occupies a molecular fraction between 0.001 and 0.1 inclusive of the lattice sites of Sr. In other words, between 0.1% and 10% inclusive of the lattice sites provided for Sr in the host lattice $Sr_7Li_2Si_5N_4O_{12}$ are occupied by RE such as Eu2+.

According to another embodiment, the host lattice of the phosphor comprises a structure comprising $Si(O,N)_4$ tetrahedra and $LiO_4$ tetrahedra. The $Si(O,N)_4$ tetrahedron and/or the $LiO_4$ tetrahedron generally comprise a tetrahedral gap. The tetrahedral gap is a region inside the respective tetrahedron. For example, the term "tetrahedral gap" is used to refer to the region in the inside of the tetrahedron that remains unoccupied when balls that touch each other are placed in the corners of the tetrahedron.

In a non-limiting embodiment, the oxygen atoms and the nitrogen atoms of the $Si(O,N)_4$ tetrahedron span the tetrahedron, with the silicon atom being located in the tetrahedral gap of the tetrahedron spanned by the oxygen atoms and the nitrogen atoms. Here, all atoms spanning the tetrahedron form a similar distance to the silicon atom located in the tetrahedral gap. For example, the distances may vary in the range from 1.631 angstroms, inclusive, to 1.722 angstroms, inclusive.

In a non-limiting embodiment, the oxygen atoms of the $LiO_4$ tetrahedron span the tetrahedron and the lithium atom is located in the tetrahedral gap of the tetrahedron spanned by the oxygen atoms.

According to a non-limiting embodiment of the phosphor, the structure of the host lattice has at least one $Si(O,N)_4$ tetrahedron and at least one $LiO_4$ tetrahedron each linked via a corner.

According to a further embodiment of the phosphor, the $LiO_4$ tetrahedron is linked to the $Si(O,N)_4$ tetrahedron via an oxygen atom. In a non-limiting embodiment, the oxygen atom linking the $LiO_4$ tetrahedron to the $Si(O,N)_4$ tetrahedron is a common oxygen atom of the $LiO_4$ tetrahedron and the $Si(O,N)_4$ tetrahedron. In other words, the oxygen atom linking the $LiO_4$ tetrahedron to the $Si(O,N)_4$ tetrahedron is part of both the $LiO_4$ tetrahedron and part of the $Si(O,N)_4$ tetrahedron.

According to a further embodiment, at least one $Si(O,N)_4$ tetrahedron is linked via a corner to at least one further $Si(O,N)_4$ tetrahedron.

According to a further embodiment of the phosphor, the $Si(O,N)_4$ tetrahedron is linked to the further $Si(O,N)_4$ tetrahedron via a nitrogen atom. In a non-limiting embodiment, the nitrogen atom linking the $Si(O,N)_4$ tetrahedron to the further $Si(O,N)_4$ tetrahedron is a common nitrogen atom of the $Si(O,N)_4$ tetrahedra. In other words, the nitrogen atom linking the $Si(O,N)_4$ tetrahedron to the further $Si(O,N)_4$ tetrahedron is part of both the $Si(O,N)_4$ tetrahedron and part of the further $Si(O,N)_4$ tetrahedron.

According to a further embodiment, the corner-linked $Si(O,N)_4$ tetrahedra form a strand. In a non-limiting embodiment, the strand comprises at least five linked $Si(O,N)_4$ tetrahedra. In a non-limiting embodiment, the host lattice of the phosphor comprises multiple strands of $Si(O,N)_4$ tetrahedra. Here, for example, a $Si(O,N)_4$ tetrahedron may be linked via at least one $LiO_4$ tetrahedron to $Si(O,N)_4$ tetrahedra of the same strand or of the neighboring strand. The $LiO_4$ tetrahedra link the strands consisting of $Si(O,N)_4$ tetrahedra to form layers.

According to a further embodiment, the $Si(O,N)_4$ tetrahedra and $LiO_4$ tetrahedra linked via a corner form channels in which at least one strontium atom is located. The channels are formed as cavities in the strands of corner-linked $Si(O,N)_4$ tetrahedra and $LiO_4$ tetrahedra.

Six lattice parameters are required to describe the three-dimensional unit cell of the crystalline host lattice, three lengths a, b and c and three angles $\alpha$, $\beta$, $\gamma$. The three lattice parameters a, b and c are the lengths of the lattice vectors spanning the unit cell. The other three lattice parameters $\alpha$, $\beta$ and $\gamma$ are the angles between these lattice vectors. $\alpha$ is the angle between b and c, $\beta$ is the angle between a and c, and $\gamma$ is the angle between a and b.

According to one embodiment, the lattice parameter a is in particular in the range from 22.80 Å to 23.20 Å, inclusive. The lattice parameter b is in particular in the range from 5.30 Å to 5.70 Å, inclusive. The lattice parameter c is particularly in the range from 6.20 Å to 6.60 Å, inclusive. The angles $\alpha$ and $\gamma$ are about 90° and the angle $\beta$ is in a range between 100.0° and 105.0°, inclusive.

According to a further embodiment, the host lattice of the phosphor comprises a structure with a monoclinic space group. In a non-limiting embodiment, the host lattice of the phosphor comprises the monoclinic space group C2.

According to one embodiment, the phosphor crystallizes in the monoclinic space group C2. In a non-limiting embodiment, the lattice parameters in the monoclinic space group C2 are a approximately equal to 22.98(1) Å, b approximately equal to 5.542(1) Å, c approximately equal to 6.477(1) Å, and the angles $\alpha$ and $\gamma$ are equal to 90° and the angle $\beta$ is approximately equal to 102.524(7°).

According to one embodiment, the phosphor comprises the same crystal structure as $Sr_7Li_2Si_5N_4O_{12}$.

The phosphor can be prepared by the process described below. Features and embodiments implemented only in connection with the phosphor may also be formed in the process, and vice versa.

According to one embodiment of the process for producing a phosphor having the general formula $EA_7A_2T1_{t1}T2_{t2}T3_{t3}N_nO_o$:RE, reactants selected from the group formed by the following reactants and combinations of these reactants are first provided: $EA_2N$, $EAO$, $A_2CO_3$, $T1_2O_3$, $T2O_2$, $T3_2O_5$, $RE_2O_3$. The reactants are then heated to a temperature between 800° C. and 1200° C., inclusive. The temperature for producing conventional phosphors, such as garnets, is usually much higher. For example, the temperature for the production of garnet phosphors is usually above 1400° C. In contrast, the temperature is significantly reduced in the present production process, resulting in a simplified production as well as an improved energy efficiency.

According to a non-limiting embodiment of the process for producing a phosphor having the general formula $EA_7A_2Si_5N_4O_{12}$:RE, reactants are first provided which are selected from the group formed by the following reactants and combinations of these reactants: $EA_2N$, $EAO$, $A_2CO_3$, $SiO_2$, $RE_2O_3$. Subsequently, the reactants are heated to a temperature between 800° C. and 1200° C., inclusive.

According to one embodiment, in a first step of the process, the reactants are homogenized. The resulting mixture of the reactants is placed in an open crucible, such as in a nickel crucible. The mixture of the reactants is heated, for example, to a temperature of about 1000° C. for about 24 hours under a nitrogen atmosphere or under a forming gas atmosphere to provide reducing conditions. The forming gas atmosphere comprises, for example, a mixture of nitrogen or argon with up to 7.5% $H_2$ or is formed from such a mixture.

According to a non-limiting embodiment of the process, $EA_2N$ is $Sr_2N$, $EAO$ is $SrO$, $A_2CO_3$ is $Li_2CO_3$, and $RE_2O_3$ is $Eu_2O_3$.

The phosphor is particularly suitable and intended for use in an optoelectronic device. Features and embodiments implemented only in connection with the phosphor and/or the process may also be formed in the optoelectronic device, and vice versa in each case.

According to one embodiment, the optoelectronic device comprises a semiconductor chip which, in operation, emits electromagnetic radiation of a first wavelength range from a radiation exit surface. The electromagnetic radiation of the first wavelength range forms the emission spectrum of the semiconductor chip.

The semiconductor chip is, for example, a light emitting diode chip or a laser diode chip. In a non-limiting embodiment, the semiconductor chip has an epitaxially grown semiconductor layer sequence with an active zone that is suitable for generating electromagnetic radiation. For this purpose, the active zone has, for example, a pn junction, a double heterostructure, a single quantum well structure or, such as a multiple quantum well structure. In a non-limiting embodiment, the semiconductor chip emits electromagnetic radiation from the ultraviolet spectral range and/or from the visible spectral range, such as from the blue spectral range, during operation.

According to a further embodiment, the optoelectronic device comprises a conversion element comprising a phosphor described herein. The phosphor converts electromagnetic radiation of the first wavelength range into electromagnetic radiation of a second wavelength range. The electromagnetic radiation of the second wavelength range forms the emission spectrum of the phosphor.

The electromagnetic radiation of the second wavelength range is different from the first wavelength range. The phosphor introduced into the conversion element imparts wavelength-converting properties to the conversion element. For example, the conversion element converts the electromagnetic radiation of the semiconductor chip only into partial electromagnetic radiation of the second wavelength range, while another part of the electromagnetic radiation of the semiconductor chip is transmitted by the conversion element. In this case, the optoelectronic device emits mixed light composed of electromagnetic radiation of the first wavelength range and electromagnetic radiation of the second wavelength range. For example, the optoelectronic device emits white light.

For example, in addition to the semiconductor chip and the phosphor described herein, another phosphor may be incorporated into the conversion element. In a non-limiting embodiment, the phosphor having the general formula $EA_7A_2Si_5N_4O_{12}$:RE is combined with a red emitting phosphor to thus generate mixed light having a color locus in the warm white range.

The mixed light with a color locus in the warm white range is generated by a combination of the blue electromagnetic radiation of the semiconductor chip, electromagnetic radiation of the red-emitting phosphor, and electromagnetic radiation of the phosphor described herein.

Nitride phosphors, for example $((Ba,Sr,Ca)AlSiN_3$:Eu, $Sr(Sr,Ca)Al_2Si_2N_6$:Eu, $(Ca,Sr,Ba)$ $Si_2O_2N_2$:Eu or $(Ca,Sr,Ba)_2Si_5N_8$:Eu, are used as red-emitting phosphors. In a non-limiting embodiment, $CaAlSiN_3$:Eu is used as red emitting phosphor.

According to one embodiment, the conversion element comprises a matrix material in which the phosphor is embedded. For example, the matrix material may be selected from the group formed by the following materials: polymers and glass. In a non-limiting embodiment, the group of polymers includes polystyrene, polysiloxane, polysilazane, PMMA, polycarbonate, polyacrylate, polytetrafluoroethylene, polyvinyl, silicone resin, silicone, epoxy resin, and transparent synthetic rubber. The group of glasses includes, for example, silicates, water glass, and fused silica.

In a non-limiting embodiment, the conversion element is formed as conversion layer. In a non-limiting embodiment, the conversion layer is applied in direct contact to the radiation exit surface of the semiconductor chip.

Furthermore, it is also possible that the conversion layer is applied to the radiation exit surface by means of an adhesive layer. Furthermore, for example, an encapsulant may be provided between the radiation exit surface and the conversion element. Thus, the conversion element is not in direct contact with the radiation exit surface. The encapsulant has a transmittance for electromagnetic radiation of at least the active zone that is at least 85%, such as 95%. The above-mentioned materials for the matrix material can also be used for the encapsulant.

According to a further embodiment of the optoelectronic device, an emission maximum of the phosphor is between 500 nanometers and 550 nanometers inclusive. The phosphor absorbs electromagnetic radiation having at least one excitation wavelength. The excitation wavelength of the phosphor in this case may be, for example, in the near ultraviolet to blue spectral range, at about 408 nanometers or 448 nanometers. The emission maximum of the phosphor is about 515 nanometers. An emission maximum of an emission spectrum of the semiconductor chip is called primary wavelength for simplification. Thus, there is an overlap of the ranges for the primary wavelength of the semiconductor chip and the excitation wavelength of the phosphor.

The emission maximum is the wavelength at which the phosphor or the semiconductor chip shows the greatest emission. The emission maximum is determined in the present case on the basis of the emission spectrum. An emission spectrum is usually a graph showing the spectral intensity or spectral luminous flux per wavelength interval ("spectral intensity/spectral luminous flux") of the electromagnetic radiation emitted by the phosphor or other element as a function of the wavelength λ. In other words, the emission spectrum represents a curve with the wavelength plotted on the x-axis and the spectral intensity or spectral luminous flux plotted on the y-axis.

According to one embodiment, the emission maximum of the phosphor is in the green-yellow spectral region. Compared to conventional phosphors, for example $Y_3(Al,Ga)_5O_{12}$:Ce, the phosphor has a shoulder in the red spectral region.

According to a further embodiment, a dominant wavelength of the electromagnetic radiation of the emission spectrum of the phosphor is between 555 nanometers and 575 nanometers, inclusive. In this case, the excitation wavelength is in the near ultraviolet to blue spectral range, for example at about 408 nanometers or 448 nanometers. In a non-limiting embodiment, the dominant wavelength of the emission spectrum of the phosphor is about 562 nanometers or 564 nanometers.

To determine the dominant wavelength of electromagnetic radiation, a straight line is drawn in a CIE standard diagram starting from the white point through the color locus of the electromagnetic radiation. The intersection of the straight line with the spectral color line bounding the CIE standard diagram designates the dominant wavelength of the electromagnetic radiation. In general, the dominant wavelength deviates from the emission maximum.

According to a further embodiment, a FWHM width of the phosphor is between 170 nanometers and 190 nanometers, inclusive. In this case, the excitation wavelength is in the near ultraviolet to blue spectral range, for example at about 408 nanometers or 448 nanometers. In a non-limiting embodiment, the FWHM width is about 182 nanometers or 175 nanometers.

The term FWHM width ("Full Width Half Maximum width") refers to a curve with a maximum, such as an emission spectrum, where the FWHM width is the area on the x-axis corresponding to the two y-values corresponding to half of the maximum.

According to a embodiment, the optoelectronic device is free of another phosphor. That is, only the phosphor with the general formula $EA_7A_2Si_5N_4O_{12}$:RE is included in the conversion element of the optoelectronic device for wavelength conversion and causes a wavelength conversion within the optoelectronic device.

According to a further embodiment, the optoelectronic device is free of a further phosphor and emits electromagnetic radiation having a correlated color temperature between 9000 K and 10000 K, inclusive.

According to a further embodiment, the optoelectronic device emits electromagnetic radiation, with a cold white color impression, for example with a correlated color temperature between 9000 K and 10000 K inclusive. A color rendering index of the electromagnetic radiation of the optoelectronic device is at least 80, such as at least 85, or at least 90. Likewise, a high red color rendering index R9 of at least 60, such as at least 70, or at least 75 is achieved.

For example, at a correlated color temperature between 9000 K and 10000 K inclusive, a high color rendering index of at least 80, such as at least 85, or at least 90, and a high red color rendering index R9 of at least 60, such as at least 70, or at least 75, are achieved. The electromagnetic radiation with the cold white color impression is obtained by a combination of the electromagnetic radiation of the first wavelength range emitted by the semiconductor chip and the electromagnetic radiation of the second wavelength range emitted by the phosphor.

The correlated color temperature is a measure to quantitatively determine the color impression of a light source. The color rendering index describes the quality of the color rendering of optoelectronic devices of the same correlated color temperature. The red color rendering index R9 is a special color rendering index for saturated red light.

According to a further embodiment, the optoelectronic device comprises a further phosphor that emits electromagnetic radiation of the first wavelength range into electromagnetic radiation of a third wavelength range. Overall, the optoelectronic device thus emits electromagnetic radiation with a correlated color temperature between 3000 K and 5000 K, inclusive. The further phosphor is a phosphor that emits electromagnetic radiation of the red spectral range. This results in a lower correlated color temperature, which has the consequence that a warm white color impression with a high color rendering index R9 is obtained.

One idea of the present optoelectronic device is to use semiconductor chips emitting different primary wavelengths from the near ultraviolet to blue spectral range for different optoelectronic devices without much difference in the color rendering index of the mixed light of the optoelectronic devices with the phosphor described herein. This can increase the process yield in production and lower the production cost. Furthermore, the proportion of rare earths in the phosphor is low, which leads to simple and low-cost production. In addition, the production temperature is lowered to increase energy efficiency.

Furthermore, when the phosphor with the general formula $EA_7A_2T1_{t1}T2_{t2}T3_{t3}N_nO_o$:RE is used without another phosphor in an optoelectronic device, a cold white color impression with a high correlated color temperature and a high color rendering index are achieved with advantage. This is due, among other things, to the broad emission spectrum and the clear shoulder in the red spectral range of the emission spectrum of the phosphor. Furthermore, an optoelectronic device with a warm white color impression with a low correlated color temperature can be realized with advantage by introducing further phosphors into the conversion element of the optoelectronic device.

BRIEF DESCRIPTION OF THE DRAWINGS

The accompanying drawings serve to provide an understanding of non-limiting embodiments. The drawings illustrate non-limiting embodiments and, together with the description, serve for explanation thereof. Further non-limiting embodiments and many of the intended advantages will become apparent directly from the following detailed description.

Identical, similar or identically acting elements are provided in the figures with the same reference signs. The figures and the proportions of the elements shown in the figures with respect to each other are not to be regarded as true to scale. Rather, individual elements, in particular layer thicknesses, may be oversized for better representability and/or better understanding.

DETAILED DESCRIPTION

Figure 1:
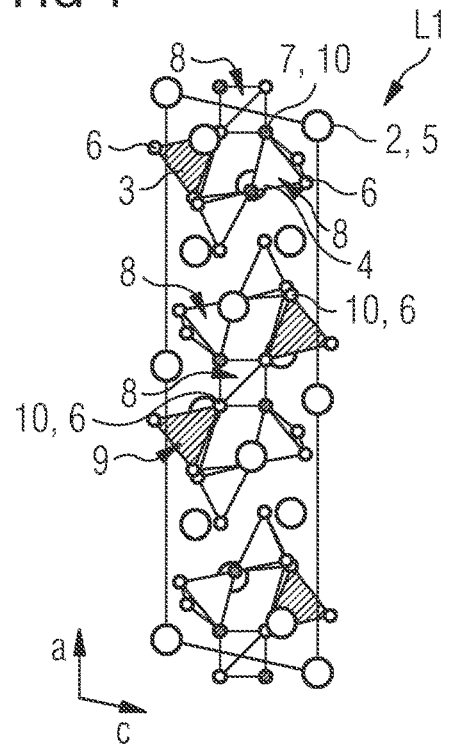
FIG. 1 a section of the host lattice of the phosphor $Sr_7Li_2Si_5N_4O_{12}$:$Eu^{2+}$ in viewing direction b according to an exemplary embodiment, FIG. 2 a section of the host lattice of the phosphor $Sr_7Li_2Si_5N_4O_{12}$:$Eu^{2+}$ in viewing direction b according to an exemplary embodiment, FIG. 3 a section of the host lattice of the phosphor $Sr_7Li_2Si_5N_4O_{12}$:$Eu^{2+}$ in viewing direction c according to an exemplary embodiment, FIG. 4 and FIG. 5 a section of the host lattice of the phosphor $Sr_7Li_2Si_5N_4O_{12}$:$Eu^{2+}$ according to an exemplary embodiment, FIG. 6 a schematic sectional view for different process stages of a process for producing a phosphor according to an exemplary embodiment, FIG. 7, FIG. 8 and FIG. 9 a schematic sectional view of an optoelectronic device according to an exemplary embodiment each, FIG. 10 two emission spectra of the phosphor $Sr_7Li_2Si_5N_4O_{12}$:$Eu^{2+}$ according to an exemplary embodiment upon excitation with primary wavelengths of the semiconductor chip of about 408 nanometers and about 448 nanometers, FIG. 11 emission spectra of $Sr_7Li_2Si_5N_4O_{12}$:$Eu^{2+}$ and a conventional phosphor with comparable dominant wavelength, FIG. 12 a color rendering index as a function of a primary wavelength of the blue emitting semiconductor chip for various optoelectronic devices with white color impression, and FIG. 13 total emission spectra for various optoelectronic devices with white color impression with a primary wavelength of the semiconductor chip of about 445 nanometers.

FIG. 1 shows a section of the host lattice of the phosphor 1 $EA_7A_2T1_{t1}T2_{t2}T3_{t3}N_nO_o$:RE, in this case of the phosphor L1 $Sr_7Li_2Si_5N_4O_{12}$:$Eu^{2+}$ in a schematic representation according to an exemplary embodiment. The host lattice has a structure with a monoclinic space group C2. The structure of the host lattice has corner-linked T1(O,N)$_4$ tetrahedra and/or T2(O,N)$_4$ tetrahedra and/or T3(O,N)$_4$ tetrahedra and AO$_4$ tetrahedra. Presently, the host lattice comprises T2(O,N)$_4$ tetrahedra with T2=Si, i.e. Si(O,N)$_4$ tetrahedra 8 and A(O,N)$_4$ tetrahedra with A=Li, i.e. LiO$_4$ tetrahedra 9.

"Corner-linked" means here and in the following that two tetrahedra are connected by a common corner 10. The corner 10 can be either a common oxygen atom 6 or a common nitrogen atom 7. The structure of the phosphor L1 was determined using X-ray structure analysis measurements, examples of the results of which are shown in Table 1. In the FIGS. 1 to 5, not all tetrahedra and atoms are given a reference sign for the sake of clarity.

The Si(O,N)$_4$ tetrahedron 8 and/or the LiO$_4$ tetrahedron 9 comprise a tetrahedral gap. The tetrahedral gap is a region inside the respective tetrahedron.

The oxygen atoms 6 and the nitrogen atoms 7 of the Si(O,N)$_4$ tetrahedron 8 span the tetrahedron, with the silicon atom 4 being located in the tetrahedral gap of the tetrahedron spanned by the oxygen atoms 6 and the nitrogen atoms 7. In a non-limiting embodiment, all atoms spanning the tetrahedron are at a similar distance from the silicon atom 4 located in the tetrahedral gap.

In the LiO$_4$ tetrahedron 9, the oxygen atoms 6 span a tetrahedron and the lithium atom 3 is located in the tetrahedral gap of the tetrahedron spanned by the oxygen atoms 6.

At least one Si(O,N)$_4$ tetrahedron 8 and at least one LiO$_4$ tetrahedron 9 are each linked to each other via an oxygen atom 6. The oxygen atom 6 linking the LiO$_4$ tetrahedron 9 to the Si(O,N)$_4$ tetrahedron 8 is a common oxygen atom 6 of the LiO$_4$ tetrahedron 9 and the Si(O,N)$_4$ tetrahedron 8. The Si(O,N)$_4$ tetrahedra 8 may likewise be linked to another Si(O,N)$_4$ tetrahedron 8 via a nitrogen atom 7. The nitrogen atom 7 linking the Si(O,N)$_4$ tetrahedron 8 to the further Si(O,N)$_4$ tetrahedron 8 is a common nitrogen atom 7 of the Si(O,N)$_4$ tetrahedron 8. The structure exhibits isolated strands formed in the present case by five Si(O,N)$_4$ tetrahedra 8 linked via common corners 10.

The Si(ON)$_4$ tetrahedra 8 and LiO$_4$ tetrahedra 9 form channels 11 linked via a corner 10, in which at least one strontium atom 2 is located. The strontium atom 2 can be replaced by europium atoms 5 as activator element. The channels 11 are formed as cavities in the strands of corner-linked Si(O,N)$_4$ tetrahedra 8 and LiO$_4$ tetrahedra 9.

Figure 2:
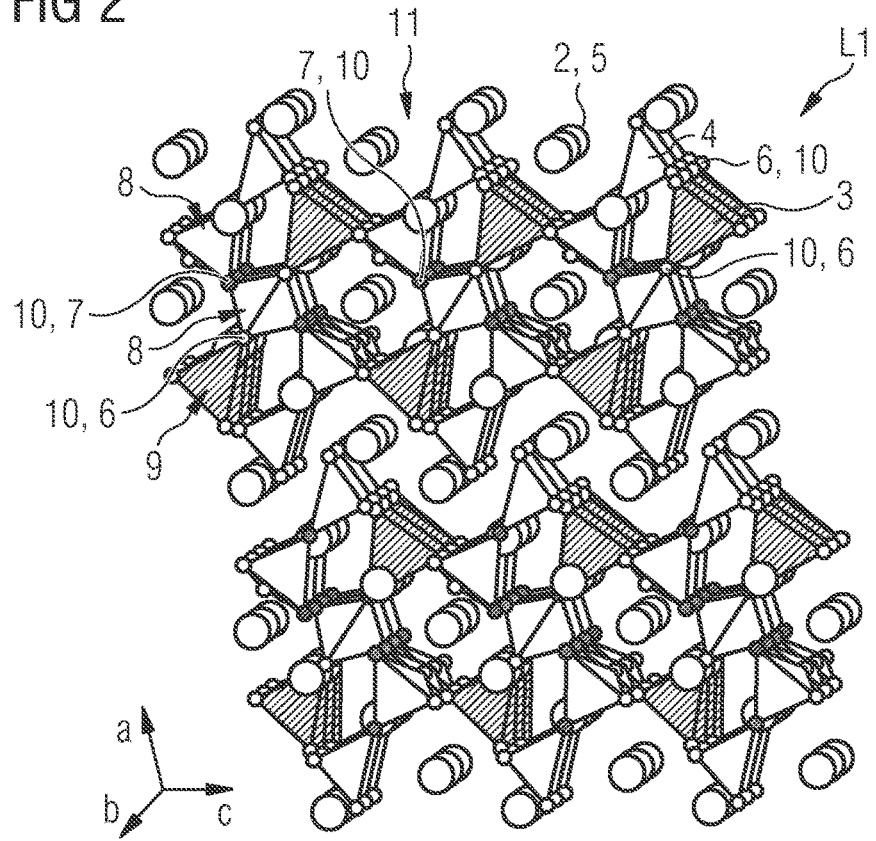

Each Si(O,N)$_4$ tetrahedron 8 is linked via at least one LiO$_4$ tetrahedron 9 to Si(O,N)$_4$ tetrahedra 8 of the same or the neighboring strand. This linkage results in layers of corners 10 linked Si(O,N)$_4$ 8 and LiO$_4$ tetrahedra 9 extending in the be plane, as shown in FIG. 2. The strontium atoms 2 and the europium atoms 5, respectively, occupy the channels 11 formed by Si(O,N)$_4$ 8 and LiO$_4$ tetrahedra 9.

Figure 3:
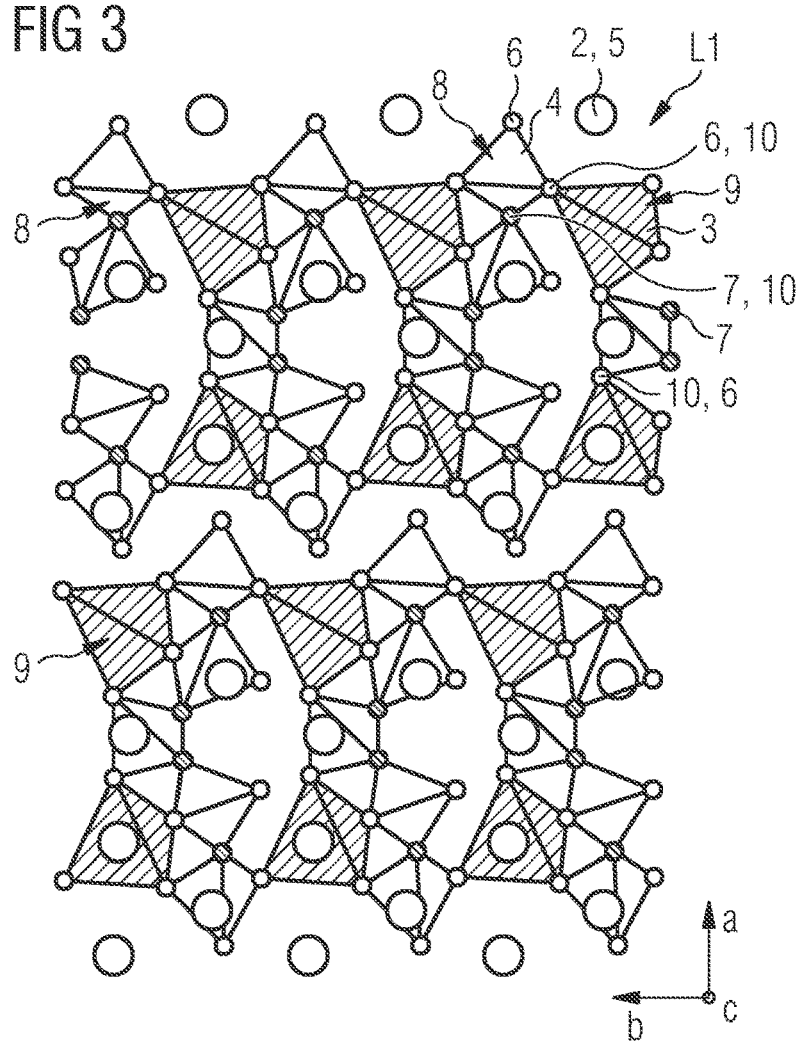

FIG. 3 differs from FIG. 2 only in the direction of view. FIG. 2 extends in viewing direction b and FIG. 3 in viewing direction c.

Table 1 below shows the crystallographic data of the phosphor L1 Sr$_7$Li$_2$Si$_5$N$_4$O$_{12}$:Eu$^{2+}$. For the monoclinic space group, the angles α and γ are equal to 90° and β, is not equal to 90°, and the lattice parameters a, b, and c differ. The mixed occupation of europium and strontium was not considered in the structure refinement due to the small atomic fraction of europium.

TABLE 1

| Crystallographic data of Sr$_7$Li$_2$Si$_5$N$_4$O$_{12}$:Eu$^{2+}$. | |
|---|---|
| Structure type | Sr$_7$Li$_2$Si$_5$N$_4$O$_{12}$ |
| Calculated composition | Sr$_7$Li$_2$Si$_5$N$_4$O$_{12}$:Eu$^{2+}$ |
| Crystal system | monoclinic |
| Space group | C2 |
| Lattice parameter | |
| a [Å] | 22.979 (4) |
| b [Å] | 5.5415 (9) |
| c [Å] | 6.4773 (11) |
| α [°] | 90 |
| β [°] | 102.524 (7) |
| γ [°] | 90 |
| Volume [As] | 805.2 (2) |
| Density [ρ/gcm$^{-3}$] | 2.519 |
| T [K] | 296 (2) |
| Total reflections | 4301 |
| Independent reflections | 1445 |
| Number of refined parameters | 132 |
| Measured reciprocal space | $-27 \leq h \leq 27, -6 \leq k \leq 6, -7 \leq l \leq 7$ |
| R1, wR2 | 2.80%, 5.93% |
| GooF | 1.043 |
| Δρ$_{min}$, Δρ$_{max}$ [eÅ$^{-3}$] | −1.16/+0.91 |

Table 2 below shows atomic layer occupancies and isotropic deflection parameters for the phosphor L1 Sr$_7$Li$_2$Si$_5$N$_4$O$_{12}$:Eu$^{2+}$.+.

Tabelle 2
Atomic positions, occupancies and isotropic deflection parameters for the phosphor L1 Sr$_7$Li$_2$Si$_5$N$_4$O$_{12}$:Eu$^{2+}$.

| Atoms | Wyckoff position | x | y | z | Occupation | U$_{iso}$ |
|---|---|---|---|---|---|---|
| Sr01 | 2a | 0.5 | 0.7537 (3) | 0 | 1 | 0.0071 (4) |
| Sr02 | 4c | 0.5714 (1) | 0.2471 (2) | 0.7556 (2) | 1 | 0.0090 (3) |
| Sr03 | 4c | 0.8640 (1) | 0.3051 (2) | 0.5627 (2) | 1 | 0.0084 (3) |
| Sr04 | 4c | 0.7793 (1) | 0.8261 (2) | 0.8176 (2) | 1 | 0.0098 (3) |
| Si05 | 2b | 0.5 | 0.6578 (8) | 0.5 | 1 | 0.0063 (9) |
| Si06 | 4c | 0.6985 (1) | 0.2974 (6) | 0.6772 (4) | 1 | 0.0065 (6) |
| Si07 | 4c | 0.5871 (1) | 0.3323 (7) | 0.2539 (4) | 1 | 0.0061 (6) |
| O08 | 4c | 0.6066 (4) | 0.5221 (2) | 0.0789 (14) | 1 | 0.0097 (18) |
| O09 | 4c | 0.6913 (4) | 0.5541 (18) | 0.7970 (17) | 1 | 0.011 (2) |
| O10 | 4c | 0.5519 (4) | 0.822 (2) | 0.6545 (12) | 1 | 0.0150 (17) |
| O11 | 4c | 0.6827 (5) | 0.0753 (18) | 0.8291 (16) | 1 | 0.010 (2) |
| O12 | 4c | 0.7673 (4) | 0.2661 (17) | 0.6529 (13) | 1 | 0.0155 (19) |
| O13 | 4c | 0.5689 (5) | 0.0774 (16) | 0.1288 (14) | 1 | 0.015 (2) |
| N14 | 4c | 0.6482 (4) | 0.279 (2) | 0.4487 (14) | 1 | 0.011 (2) |
| N15 | 4c | 0.5316 (5) | 0.473 (2) | 0.3408 (18) | 1 | 0.011 (2) |
| Li16 | 4c | 0.6431 (13) | 0.754 (7) | 0.914 (5) | 1 | 0.031 (6) |

Figure 4:
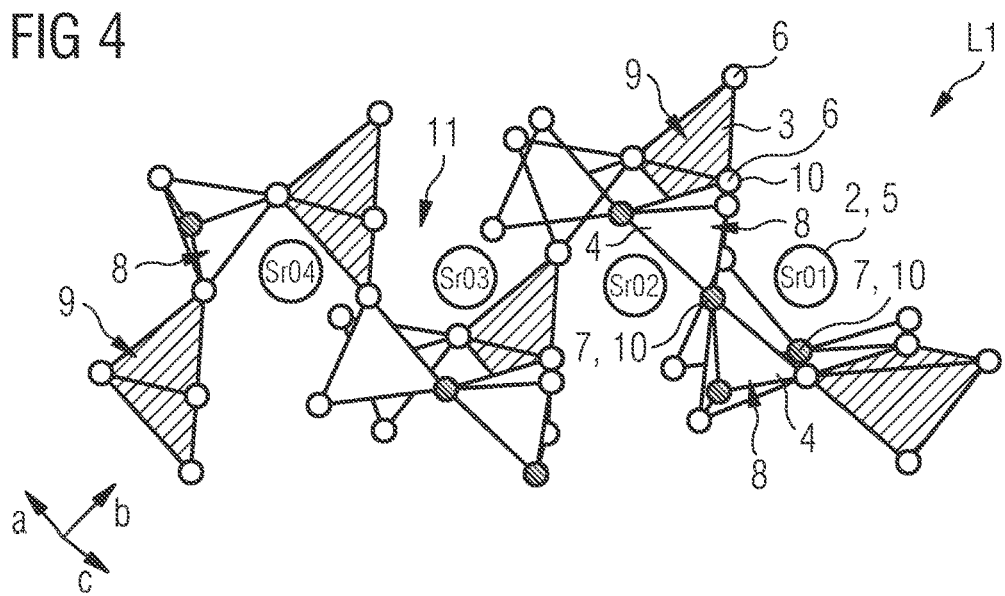
Figure 5:
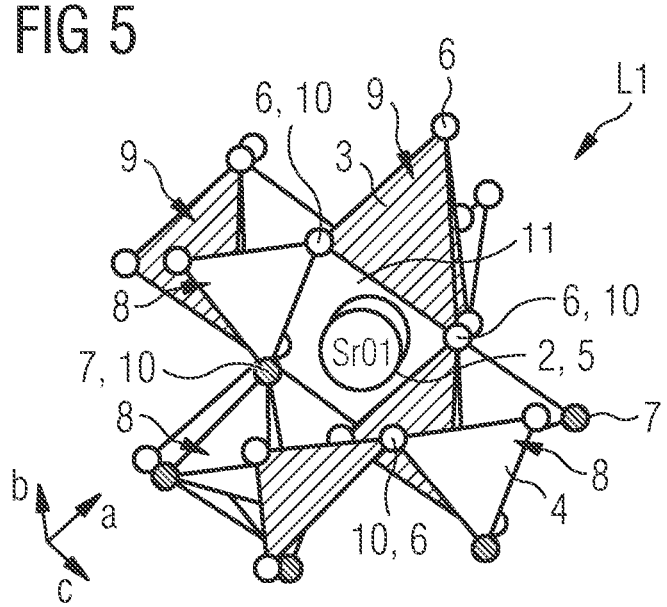

FIG. 4 and FIG. 5 schematically show a corner-linked channel 11 of Si(O,N)$_4$ 8 and LiO$_4$ tetrahedra 9 from two different perspectives. In this case, the strontium atoms 2 and the europium atoms 5 are located in the channel 11.

Figure 6:
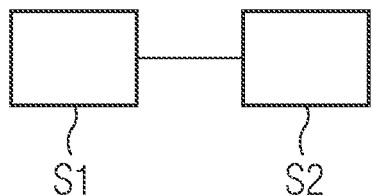

In the process according to the exemplary embodiment of FIG. 6, reactants are provided in a first process step S1. These are selected from the following group: EA$_2$N, EAO, A$_2$CO$_3$, T1$_2$O$_3$, T2O$_2$, T3$_2$O$_5$ and RE$_2$O$_3$; present EA$_2$N, EAO, A$_2$CO$_3$, SiO$_2$ and RE$_2$O$_3$. The reactants are homogeneously mixed, then the mixture is transferred to an open nickel crucible, which is transferred to a tube furnace. In a second process step S2, the mixture is heated under a forming gas atmosphere (N$_2$:H$_2$=92.5:7.5), so as to ensure reducing conditions, or under a nitrogen atmosphere at a temperature between 800° C. and 1200° C., inclusive. The mixture is heated for about 24 hours. The phosphor L1 is prepared, for example, by mixing, homogenizing and heating the reactants Sr$_2$N, SrO, SiO$_2$, Li$_2$CO$_3$ and Eu$_2$O$_3$. The corresponding ratio of each reactant to each other is shown in Table 3 as an example. The low temperature compared to conventional phosphor production processes, such as garnet phosphors, leads to simplified production as well as improved energy efficiency.

| Phosphor L1 | Reactant | Amount of substance [mmol] | Mass [g] |
| --- | --- | --- | --- |
| | Sr$_2$N | 42.78 | 8.096 |
| | SrO | 14.26 | 1.478 |
| | SiO$_2$ | 71.30 | 4.284 |
| | Li$_2$CO$_3$ | 14.26 | 1.054 |
| | Eu$_2$O$_3$ | 0.2501 | 0.088 |

Figure 7:
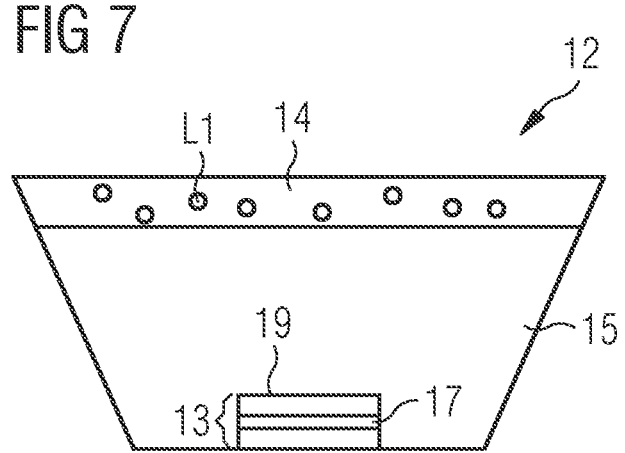

FIG. 7 shows a schematic sectional view of an optoelectronic device 12 comprising a semiconductor chip 13 which, in operation, emits electromagnetic radiation of a first wavelength range from a radiation exit surface 19. The electromagnetic radiation of the first wavelength range has an emission spectrum, which is also referred to as the emission spectrum of the semiconductor chip. For convenience, an emission maximum of the emission spectrum of the semiconductor chip is also referred to herein as a primary wavelength $\lambda_p$. The semiconductor chip 13 includes an epitaxially grown semiconductor layer sequence having an active zone 17 capable of generating electromagnetic radiation. Further, the optoelectronic device 12 comprises an encapsulant 15. The encapsulant 15 having a transmissivity to electromagnetic radiation of at least the active zone 17 that is at least 85%, such as 95%. The semiconductor chip 13 is surrounded by the encapsulant 15. Likewise, the optoelectronic device 12 has a conversion element 14 with a phosphor L1 which converts electromagnetic radiation of the first wavelength range into electromagnetic radiation of a second wavelength range. The electromagnetic radiation of the second wavelength range comprises an emission spectrum, which is also referred to as the emission spectrum of the phosphor. The phosphor L1 is embedded in a matrix material. The matrix material is selected from the group of polysiloxanes. The conversion element 14 may be formed as a conversion layer.

The optoelectronic device 12 according to the exemplary embodiment of FIG. 8 comprises a semiconductor chip 13, a carrier element 16, an adhesive layer 18, and a conversion element 14. The conversion element 14 is arranged on the radiation exit surface 19 of the semiconductor chip 13 by means of an adhesive layer 18. However, the conversion element 14 may also be directly provided on the radiation exit surface 19 of the semiconductor chip 13. The surface of the semiconductor chip 13 opposite to the radiation exit surface 19 is arranged on a carrier element 16 for stabilization. The conversion element 14 is formed as a conversion layer and comprises the phosphor L1 embedded in the matrix material.

The conversion element 14 is free of another phosphor and emits electromagnetic radiation with a correlated color temperature CCT between 9000 K and 10000 K, inclusive. Thus, a cold white color impression is achieved with a high correlated color temperature CCT and a high color rendering index CRI of at least 80, such as at least 85, or at least 90. The electromagnetic radiation with the cold white color impression is obtained by a combination of the electromagnetic radiation of the first wavelength range emitted by the semiconductor chip 13 and the electromagnetic radiation of the second wavelength range emitted by the phosphor L1.

Compared to FIG. 8, the exemplary embodiment of FIG. 9 comprises a further phosphor LX in the conversion element 14.

The further phosphor LX may be, for example, a garnet phosphor or a nitride phosphor. In a non-limiting embodiment, the phosphor is a red-emitting phosphor. For example, nitride phosphors, for example (Ba,Sr,Ca)AlSiN$_3$:Eu, Sr(Sr, Ca)Al$_2$Si$_2$N$_6$:Eu, (Ca,Sr,Ba)Si$_2$O$_2$N$_2$:Eu and (Ca,Sr,Ba)$_2$Si$_5$N$_8$:Eu are used as red-emitting phosphors. In a non-limiting embodiment, (Ba,Sr,Ca)AlSiN$_3$:Eu is used as the red emitting phosphor.

The red emitting phosphor converts electromagnetic radiation of the first wavelength range into electromagnetic radiation of a third wavelength range, such as the red spectral range. By combining phosphors emitting different colors, mixed light with a color locus in the white range, such as in the warm white range, can be generated from the electromagnetic radiation of the semiconductor chip 13 in the blue spectral range. By combining the semiconductor chip 13, which emits electromagnetic radiation of the first wavelength range, with the phosphor L1, which emits electromagnetic radiation of the second wavelength range, with the further phosphor LX, which emits electromagnetic radiation of a third wavelength range, electromagnetic radiation in the warm white range with a correlated color temperature CCT between 3000 K and 5000 K inclusive is generated.

FIG. 10 shows exemplarily two emission spectra of a phosphor L1 when excited with electromagnetic radiation of two primary wavelengths $\lambda_p$ of the semiconductor chip 13 according to an exemplary embodiment. The emission spectra are a curve in which the spectral intensity I or the spectral luminous flux per wavelength interval ("spectral intensity/spectral luminous flux") of the electromagnetic radiation emitted from the phosphor L1 is plotted on the y-axis against the wavelength $\lambda$ of the electromagnetic radiation emitted from the phosphor L1. If the primary wavelength $\lambda_p$ of the semiconductor chip is in the near ultraviolet spectral region, at about 408 nanometers, then the phosphor L1 described herein has an emission maximum in the green-yellow spectral region at about 515 nanometers with a dominant wavelength $\lambda_D$ of about 562 nanometers and a FWHM width of about 182 nanometers (solid line). Further, the primary wavelength $\lambda_p$ of the semiconductor chip may be in the blue spectral region, at about 448 nanometers. The phosphor L1 described here has an emission maximum in the green-yellow spectral region at about 525 nanometers with a dominant wavelength $\lambda_D$ of about 564 nanometers and a FWHM width of about 175 nanometers (dashed line).

Figure 11:
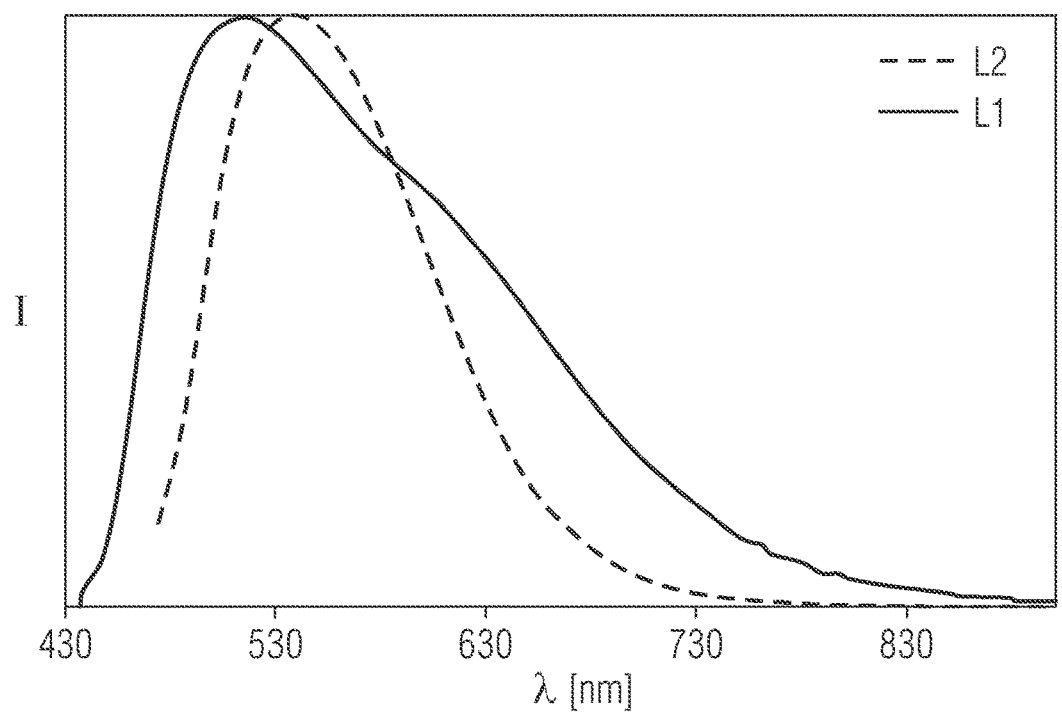

FIG. 11 shows emission spectra of the phosphor L1 $Sr_7Li_2Si_5N_4O_{12}:Eu^{2+}$ in comparison with a conventional phosphor L2 with a comparable dominant wavelength $\lambda_D$. Here, the intensity I, of the electromagnetic radiation emitted by the phosphors is plotted on the y-axis against the wavelength $\lambda$, of the electromagnetic radiation emitted by the phosphors. The conventional phosphor L2 has the general formula $Y_3(Al,Ga)_5O_{12}:Ce$. Here, the excitation wavelength of the phosphors is about 460 nanometers in the blue spectral region. The dominant wavelength $\lambda_D$ of the phosphor L1 is 562.9 nanometers. Compared with the conventional phosphor, the emission spectrum of the phosphor L1 comprises a shoulder in the red spectral region. The higher FWHM width and thus the increased proportion of reddish emission of the phosphor L1 compared to conventional phosphor L2 are shown in FIG. 11.

Figure 12:
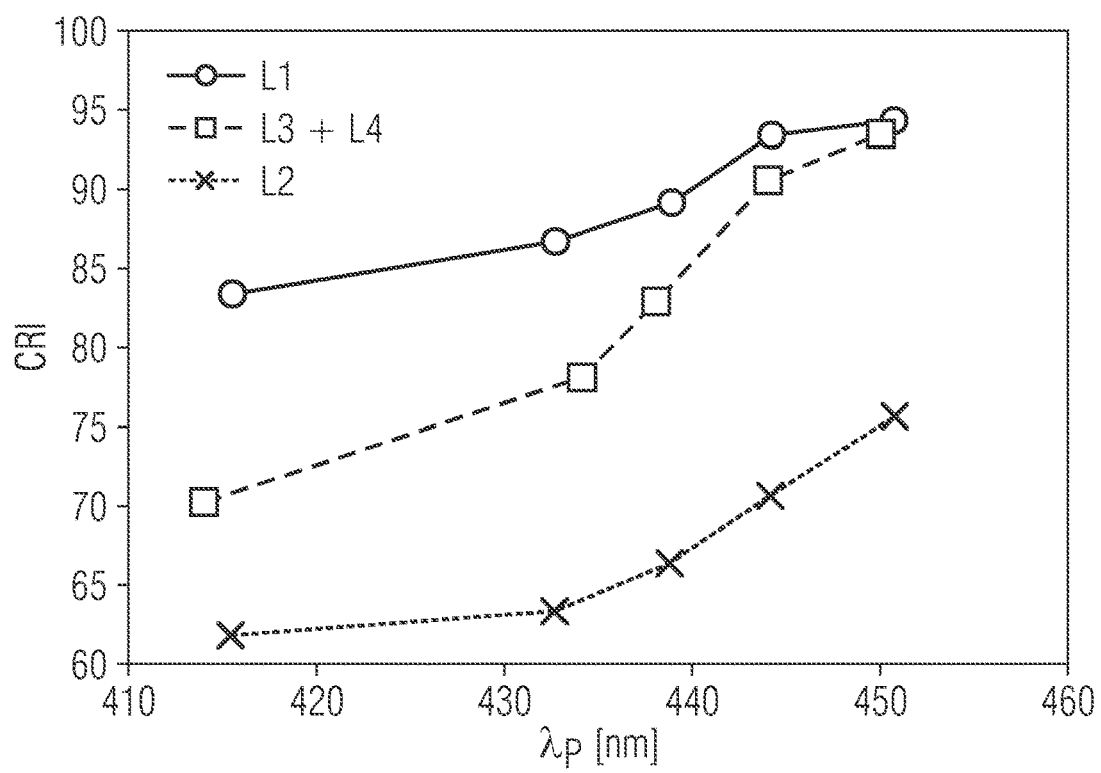

Furthermore, in FIG. 12 the color rendering index CRI is plotted against the primary wavelengths $\lambda_p$ of the semiconductor chips 13. For this purpose, the electromagnetic radiation with the emission spectrum of the phosphors L1, L2 and L3 in combination with L4 are each combined with different primary wavelengths $\lambda_p$ of different semiconductor chips 13. The phosphor L3 is described by the formula $Lu_3(Al,Ga)_5O_{12}:Ce$ and the phosphor L4 is described by the formula $CaAlSiN_3:Eu$. Four different semiconductor chips 13 with different primary wavelengths $\lambda_p$ of the semiconductor chip 13 in the blue spectral region were used. The color rendering indices CRI of the optoelectronic device 12 with the phosphor L1 shows values between 80 and 95, whereas the optoelectronic device 12 with the phosphor L2 and the combination of the phosphors L3 and L4 show lower color rendering indices CRI. L2 only shows color rendering indices CRI between 60 and 75.

Furthermore, FIG. 12 shows that it has only a minor effect on the color rendering index CRI of the optoelectronic device 12 with the phosphor L1 whether irradiation is performed with a primary wavelength $\lambda_p$ of the semiconductor chip 13 of about 415 nanometers or with a primary wavelength $\lambda_p$ of the semiconductor chip 13 of 450 nanometers. On the other hand, the different primary wavelengths $\lambda_p$ of the semiconductor chip 13 show stronger influence on the color rendering index CRI for the optoelectronic devices 12 with the phosphors L2 and L3 in combination with L4. When semiconductor chips 13 with shorter primary wavelengths $\lambda_p$ are used, the color rendering indices CRI for optoelectronic devices 12 with phosphor L2 and/or L3 in combination with L4 drop faster than when optoelectronic devices 12 with the phosphor L1 are used. For example, at a primary wavelength $\lambda_p$ of the semiconductor chip 13 of 450 nanometers to 430 nanometers, the color rendering index CRI for optoelectronic devices 12 with phosphors L3 combined with L4 is 94 and 78. In the case of the optoelectronic components 12 with the phosphor L1, the color rendering index CRI is 95 and 87 (see Table 4). As a result, semiconductor chips 13 emitting different primary wavelengths $\lambda_p$ of the electromagnetic radiation of the blue spectral range can be used for different optoelectronic devices 12 without much difference in the color rendering index CRI of the optoelectronic devices 12 with the phosphor L1 described here. Advantageously, this leads to a higher process yield and a reduction of production costs.

Figure 13:
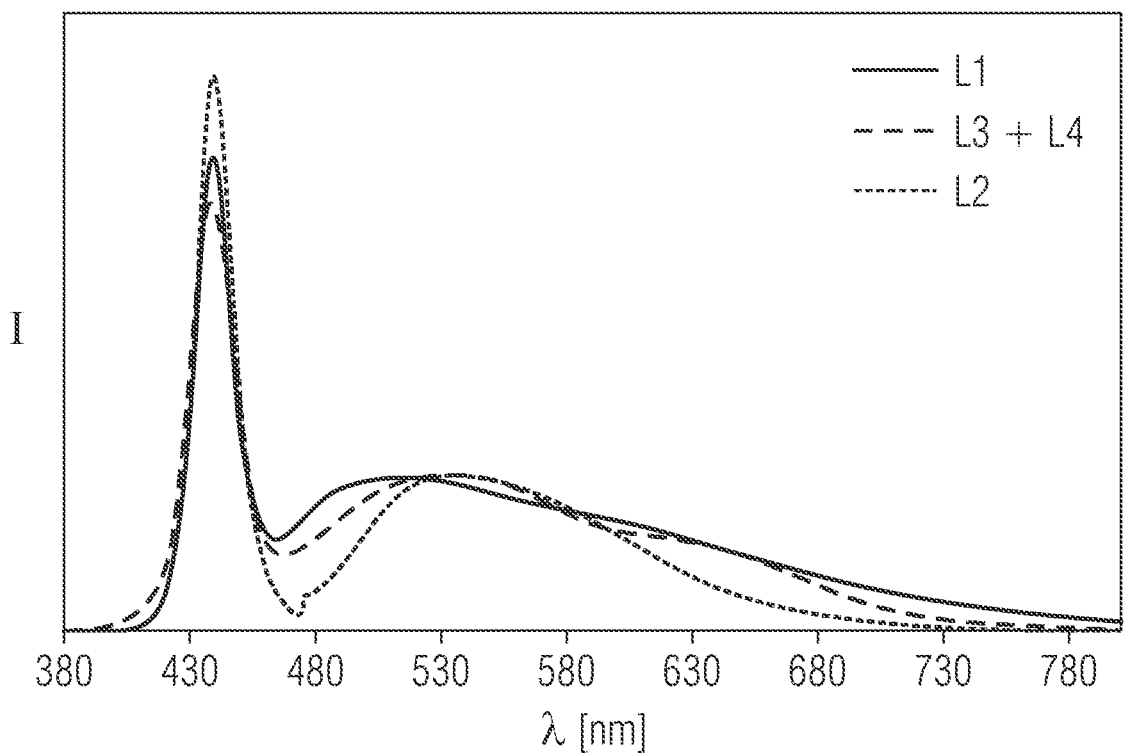

FIG. 13 shows a complete emission spectrum from 380 nanometers to 780 nanometers of the optoelectronic device 12 with the phosphor L1, L2 and the combination of L3 and L4. Here, the intensity I is plotted against the wavelength $\lambda$ of the electromagnetic radiation emitted by the phosphors. It can be seen that the overall emission spectrum of the optoelectronic device 12 with the phosphor L1 exhibits a broader FWHM width than the comparable conventional optoelectronic devices 12 with phosphors L2 and L3 in combination with L4. Similarly, a distinct shoulder is visible in the red spectral region of the total emission spectrum of the optoelectronic device 12 with the phosphor L1.

Table 4 lists primary wavelengths $\lambda_p$ of the semiconductor chip 13, dominant wavelengths $\lambda_D$, color rendering indices CRI, correlated color temperatures CCT, color loci $CIE_x$ and $CIE_y$, and red color rendering indices R9 for optoelectronic devices 12 with the phosphors L1, L2, and L3 in combination with L4. The comparable optoelectronic devices 12 with the phosphor L2 and the phosphors L3 and L4, respectively, show color loci close to those with the phosphor L1. Table 4 shows that the optoelectronic device 12 with the phosphor L1 exhibits a high correlated color temperature CCT, CCT≥9000 K at the same time as a high color rendering index CRI, CRI≥80, such as 85, such as 90, and a high red color rendering index R9, R9≥60, such as R9≥70, such as R9≥75.

Tabelle 4
Spectral data of various optoelectronic devices 12.

| Solution | $\lambda_P$ [nm] | $\lambda_D$ [nm] | $CIE_x$ | $CIE_y$ | CCT [K] | CRI | R9 |
|---|---|---|---|---|---|---|---|
| L1 | 415.5 | 442.5 | 0.286 | 0.294 | 9156 | 83 | 67 |
| L2 | 415.5 | 442.5 | 0.277 | 0.293 | 10120 | 62 | −46 |
| L3 + L4 | 414.0 | 426.1 | 0.286 | 0.294 | 9172 | 70 | 50 |
| L1 | 432.6 | 440.1 | 0.286 | 0.293 | 9201 | 87 | 72 |
| L2 | 432.6 | 440.1 | 0.278 | 0.294 | 10033 | 63 | −43 |
| L3 + L4 | 434.0 | 439.8 | 0.286 | 0.293 | 9170 | 78 | 62 |
| L1 | 438.7 | 444.6 | 0.283 | 0.290 | 9674 | 89 | 75 |
| L2 | 438.7 | 444.6 | 0.274 | 0.289 | 10742 | 66 | −39 |
| L3 + L4 | 438.0 | 444.4 | 0.283 | 0.290 | 9620 | 83 | 70 |
| L1 | 444.2 | 449.8 | 0.279 | 0.287 | 10305 | 94 | 80 |
| L2 | 444.2 | 449.8 | 0.272 | 0.286 | 11522 | 71 | −35 |
| L3 + L4 | 444.0 | 449.6 | 0.279 | 0.287 | 10242 | 91 | 81 |
| L1 | 450.8 | 455.4 | 0.270 | 0.276 | 12447 | 95 | 90 |
| L2 | 450.8 | 455.4 | 0.284 | 0.276 | 13996 | 76 | −24 |
| L3 + L4 | 450.0 | 454.9 | 0.270 | 0.276 | 12515 | 94 | 95 |

The invention is not limited to the exemplary embodiments by the description based thereon. Rather, the invention encompasses any new feature as well as any combination of features, which particularly includes any combination of features in the patent claims, even if that feature or this combination itself is not explicitly stated in the patent claims or exemplary embodiments.

This patent application claims the priority of the German patent application DE 10 2019 104 008.6, the disclosure content of which is hereby incorporated by reference.

LIST OF REFERENCE SIGNS 1 phosphor
2 strontium atom
3 lithium atom
4 silicon atom
5 europium atom
6 oxygen atom
7 nitrogen atom
8 $Si(O,N)_4$ tetrahedron
9 $LiO_4$ tetrahedron
10 corner
11 channels
12 optoelectronic device
13 semiconductor chip 14 conversion element
15 encapsulant
16 carrier element
17 active zone
18 adhesive layer
19 radiation exit surface
S1 process step
S2 process step
L1 phosphor 1
L2 phosphor 2
L3 phosphor 3
L4 phosphor 4
CCT correlated color temperature
CRI color rendering index
R9 red color rendering index
$CIE_x$ color locus
$CIE_Y$ color locus
$\lambda_p$ primary wavelength
$\lambda_D$ dominant wavelength

The invention claimed is:

1. A phosphor having the general formula $EA_7A_2T1_{t1}T2_{t2}T3_{t3}N_nO_o$:RE, wherein
EA is selected from the group of divalent elements,
A is selected from the group of monovalent elements,
T1 is selected from the group of trivalent elements,
T2 is selected from the group of tetravalent elements,
T3 is selected from the group of pentavalent elements,
RE is an activator element,
$16+3\,t1+4\,t2+5\,t3-3\,n-2\,o=0$, and
$t1+t2+t3=5$; $n+o=16$; $0 \leq t1 \leq 4$; $0 \leq t2 \leq 5$; $0 \leq t3 \leq 5$; $0 \leq n \leq 9$; $7 \leq o \leq 16$.

2. The phosphor according to claim 1,
further comprising a host lattice with a structure comprising $AO_4$ tetrahedra and at least one of the following tetrahedra selected from the group comprising: $T1(O,N)_4$ tetrahedra, $T2(O,N)_4$ tetrahedra, $T3(O,N)_4$ tetrahedra, and combinations thereof.

3. The phosphor according to claim 2,
wherein the tetrahedra of the host lattice are each linked via a corner.

4. The phosphor according to claim 2,
wherein the at least one tetrahedron selected from the group comprising $T1(O,N)_4$ tetrahedron, $T2(O,N)_4$ tetrahedron, $T3(O,N)_4$ tetrahedron, and combinations thereof is linked via a corner to at least one further tetrahedron selected from the group comprising $T1(O,N)_4$ tetrahedron, $T2(O,N)_4$ tetrahedron, $T3(O,N)_4$ tetrahedron, and combinations thereof.

5. The phosphor according to claim 3,
wherein the tetrahedra linked via the corner form channels where at least one EA atom is located.

6. The phosphor according to claim 1, wherein the general formula $EA_7A_2T1_{t1}T2_{t2}T3_{t3}N_nO_o$:RE is $EA_7A_2Si_5N_4O_{12}$:RE.

7. The phosphor according to claim 6,
wherein EA comprises one or more elements selected from the group consisting of Mg, Ca, Sr, Ba, and combinations thereof.

8. The phosphor according to claim 6,
wherein A comprises one or more elements selected from the group consisting of Li, Na, K, Rb, Cs, and combinations thereof.

9. The phosphor according to claim 6,
wherein RE comprises one or more elements selected from the group consisting of rare earth elements, manganese, chromium, nickel, and combinations thereof.

10. The phosphor according to claim 6,
wherein the general formula $EA_7A_2T1_{t1}T2_{t2}T3_{t3}N_nO_o$:RE is $(EA_{1-a}RE_a)_7A_2Si_5N_4O_{12}$, wherein a ranges from 0.001, inclusive to 0.1, inclusive.

11. The phosphor according to claim 6,
wherein the general formula $EA_7A_2T1_{t1}T2_{t2}T3_{t3}N_nO_o$:RE is $Sr_7Li_2Si_5N_4O_{12}$:RE.

12. The phosphor according to claim 2,
wherein the host lattice of the phosphor comprises a structure with a monoclinic space group.

13. A process for producing a phosphor having the general formula $EA_7A_2T1_{t1}T2_{t2}T3_{t3}N_nO_o$:RE, wherein the process comprises:
providing reactants comprising $EA_2N$, EAO, $A_2CO_3$, $T1_2O_3$, $T2O_2$, $T3_2O_5$, $RE_2O_3$, and combinations thereof;
heating the reactants to a temperature ranging from 800° C., inclusive to 1200° C., inclusive; wherein:
EA is selected from the group of divalent elements;
A is selected from the group of monovalent elements;
T1 is selected from the group of trivalent elements;
T2 is selected from the group of tetravalent elements;
T3 is selected from the group of pentavalent elements;
RE is an activator element;
$16+3t1+4t2+5t3-3n-2o=0$; and
$t1+t2+t3=5$; $n+o=16$; $0 \leq t1 \leq 4$; $0 \leq t2 \leq 5$; $0 \leq t3 \leq 5$; $0 \leq n \leq 9$; $7 \leq o \leq 16$.

14. The process for producing a phosphor according to claim 13, wherein $EA_2N$ is $Sr_2N$, EAO is SrO, $A_2CO_3$ is $Li_2CO_3$, and $RE_2O_3$ is $Eu_2O_3$.

15. An optoelectronic device comprising:
a semiconductor chip configured to emit electromagnetic radiation of a first wavelength range from a radiation exit surface;
a conversion element comprising a phosphor according to claim 1 configured to convert electromagnetic radiation of the first wavelength range into electromagnetic radiation of a second wavelength range.

16. The optoelectronic device according to claim 15,
wherein an emission maximum of the phosphor ranges from 500 nanometers, inclusive to 550 nanometers, inclusive.

17. The optoelectronic device according to claim 15,
wherein a dominant wavelength of the phosphor ranges from 555 nanometers, inclusive to 575 nanometers, inclusive.

18. The optoelectronic device according to claim 15,
wherein a FWHM width of the phosphor ranges from 170 nanometers, inclusive to 190 nanometers, inclusive.

19. The optoelectronic device according to claim 15,
wherein a further phosphor is absent; and
is configured to emit electromagnetic radiation having a correlated color temperature ranging from 9000 K, inclusive to 10000 K inclusive.

20. The optoelectronic device according to claim 15,
further comprising a further phosphor configured to convert electromagnetic radiation of the first wavelength range into electromagnetic radiation of a third wavelength range and electromagnetic radiation having a correlated color temperature ranging from 3000 K, inclusive to 5000 K, inclusive.

* * * * *